United States Patent [19]
Polgreen et al.

[11] Patent Number: 5,465,189
[45] Date of Patent: Nov. 7, 1995

[54] LOW VOLTAGE TRIGGERING SEMICONDUCTOR CONTROLLED RECTIFIERS

[75] Inventors: Thomas L. Polgreen, Dallas, Tex.; Amitava Chatterjee, Garland; Ping Yang, Richardson, all of Tex.

[73] Assignee: Texas Instruments Incorporated, Dallas, Tex.

[21] Appl. No.: 289,983

[22] Filed: Aug. 12, 1994

Related U.S. Application Data

[63] Continuation of Ser. No. 104,281, Aug. 10, 1993, abandoned, which is a continuation of Ser. No. 488,590, Mar. 5, 1990, abandoned.

[51] Int. Cl.⁶ .................................................... H02H 9/04
[52] U.S. Cl. ....................... 361/58; 361/91; 257/357
[58] Field of Search ......................... 361/91, 96, 98; 257/355, 356, 357, 360

[56] References Cited

U.S. PATENT DOCUMENTS

| | | | |
|---|---|---|---|
| 4,400,711 | 8/1983 | Avery | 357/43 |
| 4,595,941 | 6/1986 | Avery | 357/43 |
| 4,697,199 | 9/1987 | De Graaff et al. | 357/23.13 |
| 4,777,518 | 10/1988 | Mihara et al. | 357/23.13 |
| 4,890,187 | 12/1989 | Tailliet et al. | 361/111 |
| 4,896,243 | 1/1990 | Chatterjee et al. | 362/91 |
| 4,939,616 | 7/1990 | Rountree | 361/56 |
| 5,012,317 | 4/1991 | Rountree | 361/56 |
| 5,012,853 | 6/1991 | Mistry | 357/23.13 |
| 5,041,895 | 8/1991 | Contiero et al. | 357/43 |
| 5,072,268 | 12/1991 | Rumennik | 357/23.4 |
| 5,225,702 | 6/1993 | Chatterjee | 257/360 |

FOREIGN PATENT DOCUMENTS

| 0257774 | 3/1988 | European Pat. Off. |
| 56-40272 | 1/1981 | Japan. |

OTHER PUBLICATIONS

L. R. Avery, "Using SCR's as Transient Protection Structures in Integrated Circuits", RCA DSRC, pp. 177–180.

A Process–Tolerant Input Protection Circuit for Advanced CMOS Processes, written by Rountree, et al., 1988 EOS/ESD Symposium, pp. 201–205.

Primary Examiner—Todd Deboer
Attorney, Agent, or Firm—Ira S. Matsil; James C. Kesterson; Richard L. Donaldson

[57] ABSTRACT

A new semiconductor controlled rectifier which may be used to provide on-chip protection against ESD stress applied at the input, output, power supply pins or between any arbitrary pair of pins of an integrated circuit is disclosed. The structure which has the lowest breakdown voltage for a given technology is incorporated into the SCR enabling a SCR trigger voltage determined by the lowest breakdown-structure.

37 Claims, 15 Drawing Sheets

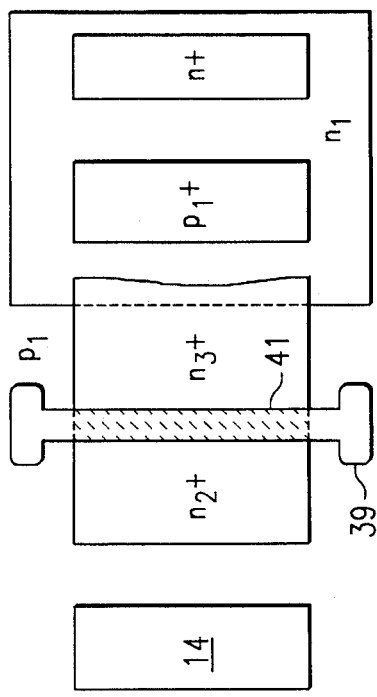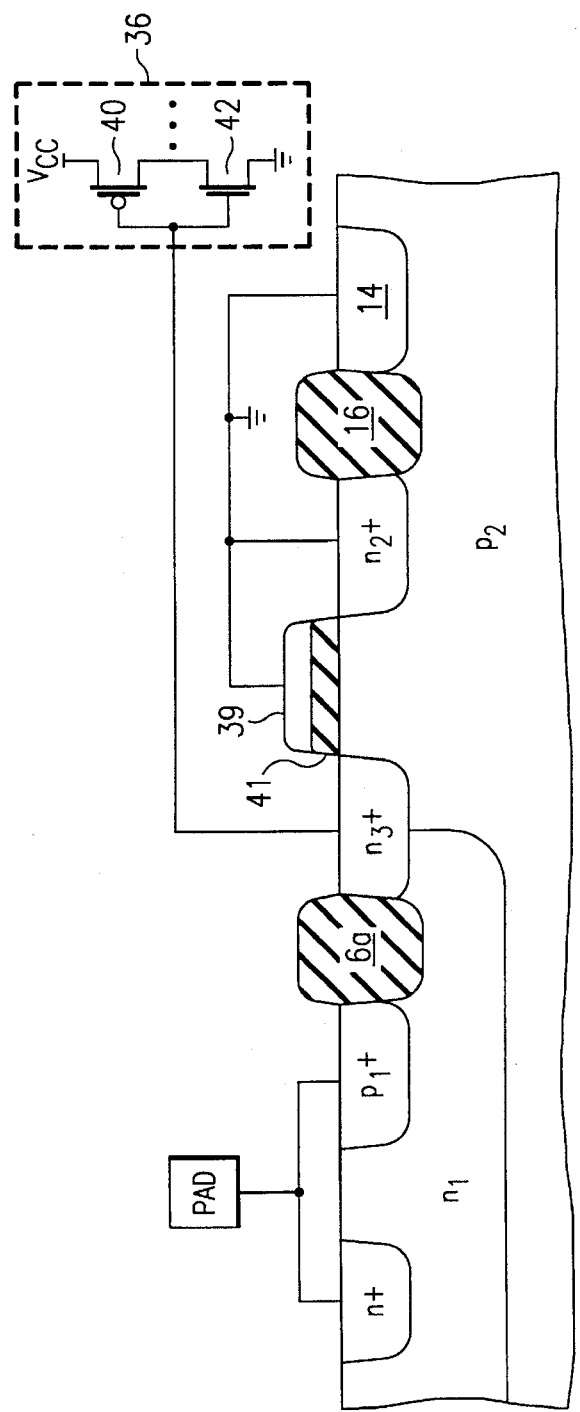

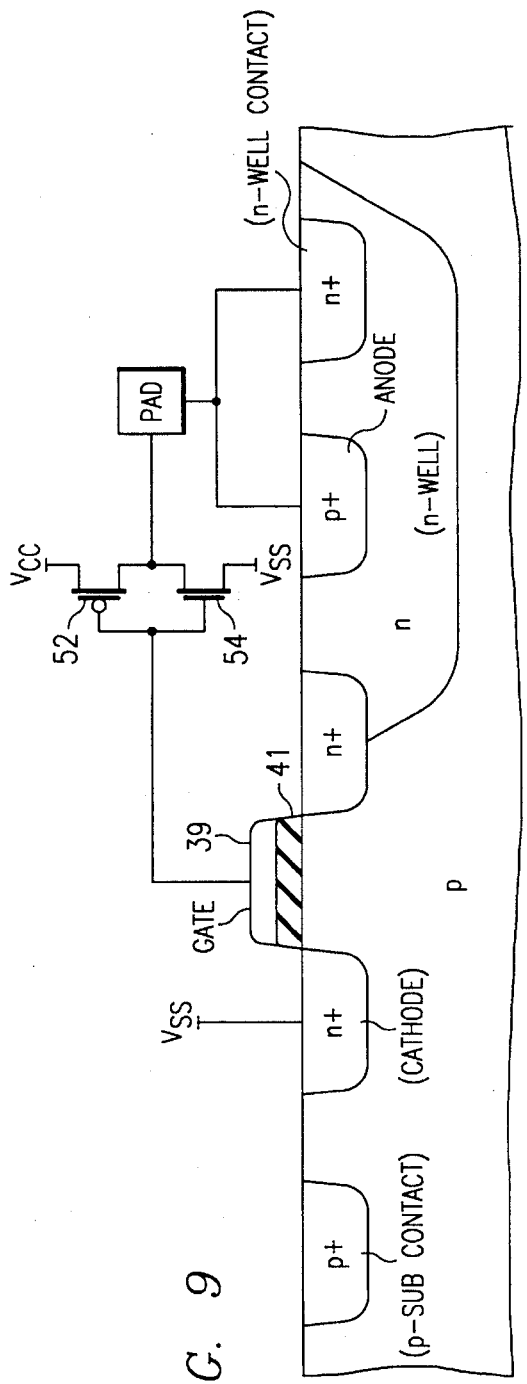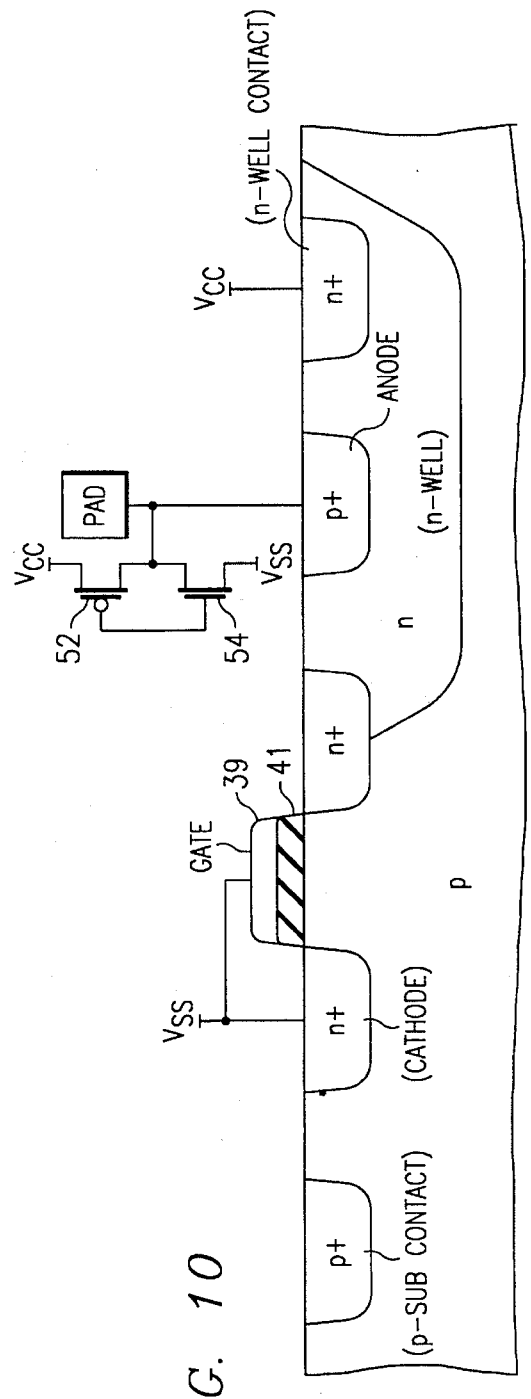

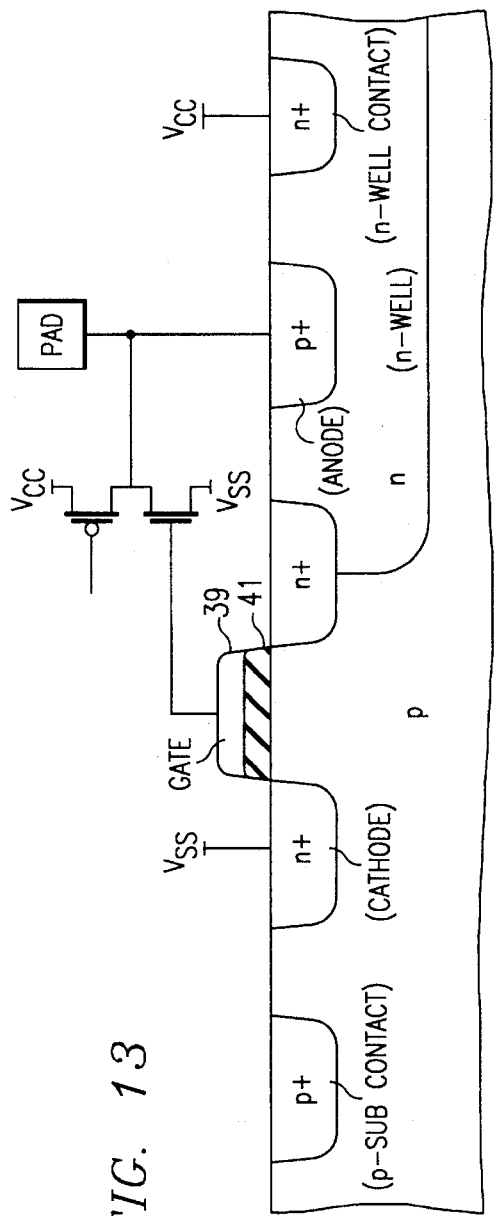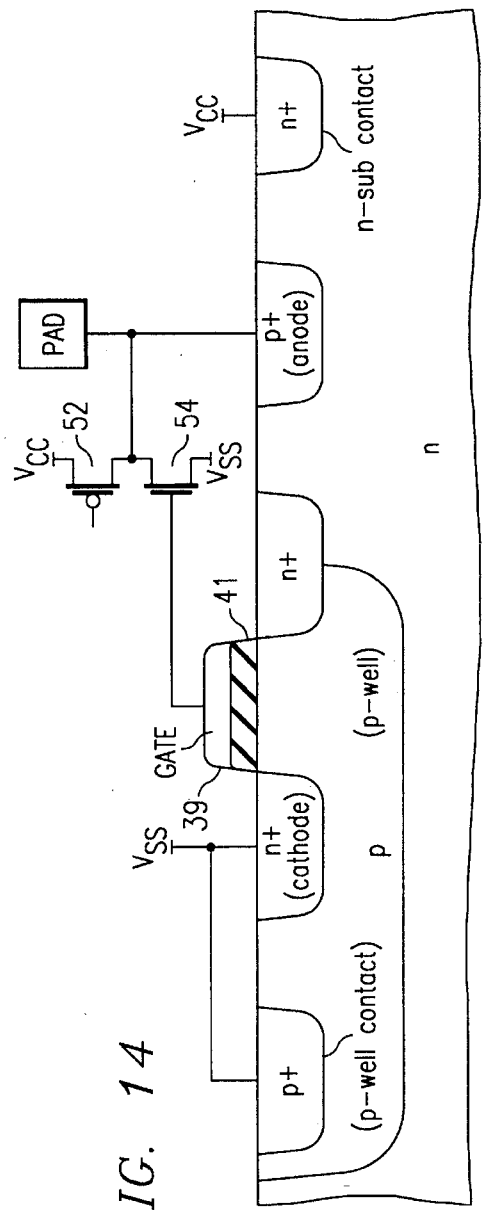
FIG. 13
FIG. 14

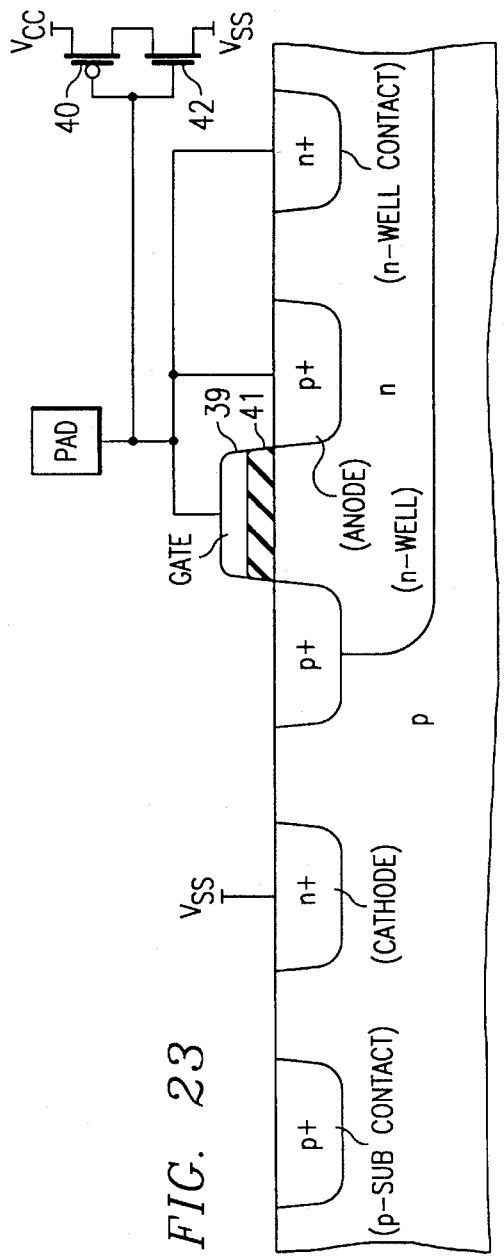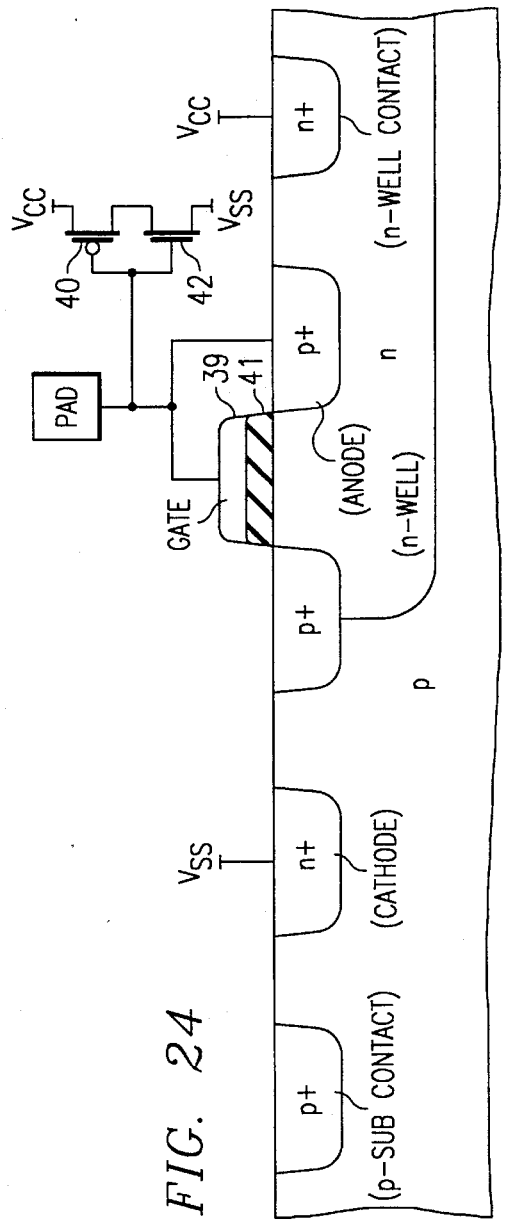

LOW VOLTAGE TRIGGERING SEMICONDUCTOR CONTROLLED RECTIFIERS

This application is a Continuation of application Ser. No. 08/104,281, filed Aug. 10, 1993, which is a continuation of Ser. No. 07/488,590 issued Mar. 05, 1990, both now abandoned.

BACKGROUND OF THE INVENTION

In handling a semiconductor chip package, electrostatic discharge (ESD) may result in damage to the semiconductor devices on the chip. On-chip protection circuits are used to provide a safe discharge path. The protection circuit is basically a switch which is off during normal circuit operation and turns on during an ESD event when a high voltage is present at a pin of the chip. Various devices can be used to accomplish this switching function. In a CMOS technology the semiconductor controlled rectifier (SCR) is ideal for this application because in its conducting state the heat generation is distributed uniformly within a large volume. One such SCR structure, referred to as the lateral SCR (LSCR) has been described in detail by Rountree, et al, in an article entitled "A Process Tolerant Input Protection Circuit for Advanced CMOS Processes" (EOS/ESD Symposium Proceedings, PP. 201–205, 1988). A typical CMOS technology in which this SCR device has been fabricated is described in "An 0.8 Micron CMOS Technology for High Performance Logic Applications," R. A. Chapman, et al., IEDM Technical Digest, 1987, PP 362–365. Both of these articles are hereby incorporated by reference.

The trigger voltage of an LSCR is generally not low enough to permit its use as the sole device for ESD protection. For the case of providing input protection for a circuit, a secondary circuit is employed in conjunction with the LSCR. This secondary circuit generally has a low clamping voltage to provide initial protection for gate oxides of the device for which input protection is sought. For example, the secondary circuit may comprise a resistor connected in series between an input pad and input of the device for which ESD protection is sought. The LSCR is then connected to and between the input pad and circuit ground. The resistor allows the voltage across the LSCR to increase to the LSCR trigger voltage at which time the current is shunted through the LSCR. For outputs, the scheme described above cannot be used because circuit performance requirements generally prohibit the use of a series resistance. Therefore, the LSCR is not useful to protect the output.

FIG. 1$a$ illustrates a cross-sectional view of a typical LSCR. As shown, region $p_{1+}$, formed of heavily doped p-type semiconductor material, is the anode and region $n_{2+}$, formed of heavily doped n-type semiconductor material, is the cathode of the LSCR. The two base regions of the LSCR are well region $n_1$ formed of n-type semiconductor material and region $p_2$ formed of p-type semiconductor material such that region $n_1$ is interposed between regions $p_{1+}$ and $p_2$ while region $p_2$ is interposed between region $n_{2+}$ and $n_1$. Junctions are shown as $j_1$, the boundary between regions $p_{1+}$ and $n_1$; $j_2$, the boundary between regions $n_1$ and $p_2$; and $j_3$, the boundary between regions $p_2$ and $n_{2+}$. Regions $n_1$ and p2 may optionally be contacted by heavily doped semiconductor material of the same type as shown by regions n+ (heavily doped n-type) and 14 (heavily doped p-type). Alternately, one or both of the base regions may be contacted from below by heavily doped regions. At a surface, the usual isolation material, such as thick oxide 6, is interposed between the anode $p_{1+}$ and the cathode $n_{2+}$. This LSCR device acts as a switch when the anode potential is raised positive with respect to the cathode potential. As the anode potential is raised positively, junction j2 becomes reverse biased and junctions j1 and j3 become slightly forward biased to accommodate leakage current from junction j2. Since the only current flowing is the leakage current from junction j2, the LSCR is considered to be off (known as the forward blocking state). As the anode potential is raised further, the junction j2 enters avalanche breakdown and a large number of electron-hole pairs are generated therein. The electrons enter base region $n_1$ and the holes enter region $p_2$ causing both junctions j1 and j3 to become more forward biased. The forward biased junctions inject additional carriers into the base regions. More specifically, electrons are injected by the cathode and holes by the anode. This results in positive feedback. This positive feedback loop is usually represented by the circuit schematic of FIG. 1$b$. As shown, the LSCR may be represented by npn bipolar transistor 26 and pnp bipolar transistor 28 in a constructive feedback configuration. Resistors 21 and 22 represent the resistance of each of the LSCR base regions. The chip input is labeled PAD. Regions $p_{1+}$, $p_2$, $n_{2+}$ and $n_1$ are also identified. At a certain level of feedback, instability is reached. As a result, the potential difference between the anode and the cathode collapses and the current through the device increases. In other words, the LSCR device has triggered from the off condition to the on condition (known as the forward conducting state). Once the LSCR is on, it is very robust and can shunt large currents without failing. As an example, an LSCR fabricated in the CMOS technology referenced above with a width of 100 microns can withstand a Human Body Model (HBM) ESD event in excess of 8000 V. It is important that the voltage at which the LSCR triggers is at least the breakdown voltage of junction j2. In the CMOS technology referenced above, this trigger voltage is approximately 50 Volts.

Previous SCR structures used for ESD protection can withstand high levels of ESD stress. Once the SCR is triggered, it provides very good on-chip protection. However, the problem with prior art SCR devices is their high trigger voltage. There are a variety of structures, for which ESD protection is desired, which may be damaged at voltages less than the trigger voltage of these SCRs. Therefore, an SCR alone is ineffective in providing protection for these structures. Prior art schemes of ESD protection at the input pads of a device have included an SCR as part of an input protection circuit. Unfortunately, designing such a circuit is expensive and complicated. Moreover, for output or input/output (I/O) pads, no such circuit is available. Therefore, until now, SCRs have not been useful for protecting output or I/O pads.

OBJECTS OF THE INVENTION

It is an object of the invention to provide a new and improved semiconductor controlled rectifier.

It is another object of the invention to provide a new and improved ESD input protection scheme.

It is a further object of the invention to provide a new and improved ESD output protection scheme.

It is still a further object of the invention to provide an ESD protection scheme for devices connected between power busses.

These and other objects of the invention will become apparent when read together with the detailed specification

SUMMARY OF THE INVENTION

The foregoing objects of the invention are accomplished by a semiconductor controlled rectifier which incorporates a structure with the purpose of triggering the SCR at a low voltage. The incorporated structure, referred to as the critical element has a breakdown voltage equal to or lower than all other structures in a given technology. The breakdown of this critcal element is a thin-oxide MOS transistor (nMOS or pMOS) with the minimum gate length allowable in the technology. The MOS transistor, for instance, the nMOS transistor, is made an integral part of the SCR in the following way: the cathode of the SCR is also the source of the nMOS and the drain is part of the n-type base region of the SCR. The gate of the nMOS may be connected in different ways depending upon the particular application. Since the breakdown voltage of an nMOS transistor is a function of its gate length, the trigger voltage of the SCR can be easily tuned by varying the gate length of the SCR's incorporated nMOS structure. The trigger voltage would also change if the gate-oxide thickness is changed.

Various embodiments of the basic structure described above can be conceived and various ESD protection schemes can be made by connecting the low-voltage triggering SCR in different ways in the chip. The following paragraphs delineate a few specific examples.

An input protection scheme may be obtained by connecting the anode and the n-type base to the input pad, the gates of the input MOS transistors to the drain of the SCR's incorporated nMOS structure, and the cathode to the ground bus of the chip.

An output protection scheme may be obtained by connecting the anode and the n-type base to the output pad, the gate of the output nMOS transistor to the gate of the SCR's incorporated nMOS structure, and the cathode to the ground bus of the chip.

A power bus protection scheme may be obtained by connecting the anode and the n-type base to the positive power bus and the negative power bus to the cathode and the gate of the SCR's incoporated nMOS structuree. If in addition all other pads are connected to the two power busses by diodes, a general protection scheme (i.e., for ESD stress between any two pins) is attainable.

BRIEF DESCRIPTION OF THE DRAWINGS

FIG. 3 illustrates a top view of the invention's SCR according to its first preferred embodiment.

FIG. 4 illustrates a cross-sectional view/schematic drawing of the preferred embodiment of an input protection scheme of the invention.

FIGS. 8–29 illustrate cross-sectional views/schematic drawings of alternative embodiments of the invention.

DETAILED DESCRIPTION OF THE INVENTION

Figure 1B:
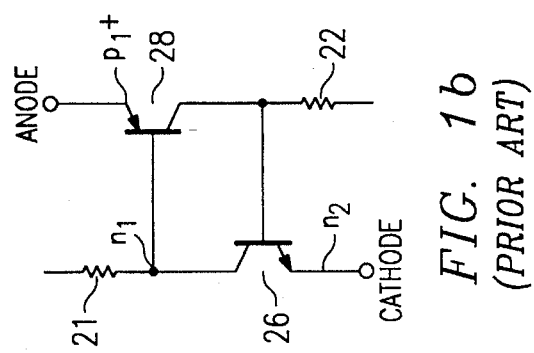
FIG. 1b shows a circuit schematic representation of the LSCR.
Figure 1A:
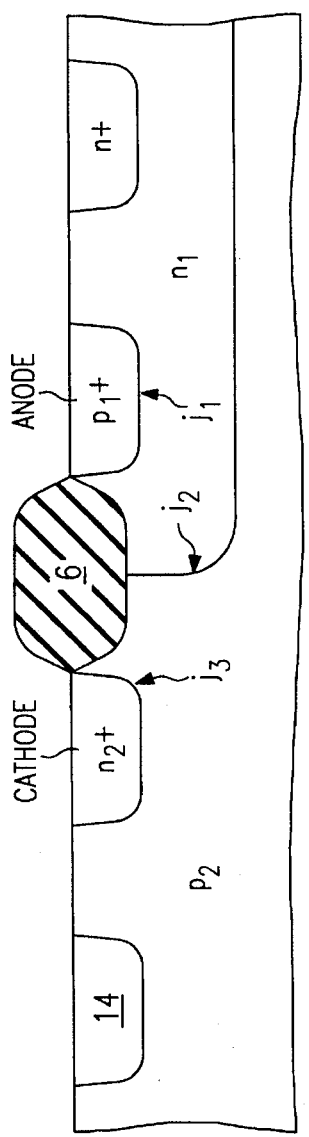
FIG. 1a illustrates a cross-sectional view of a typical LSCR.
Figure 2:
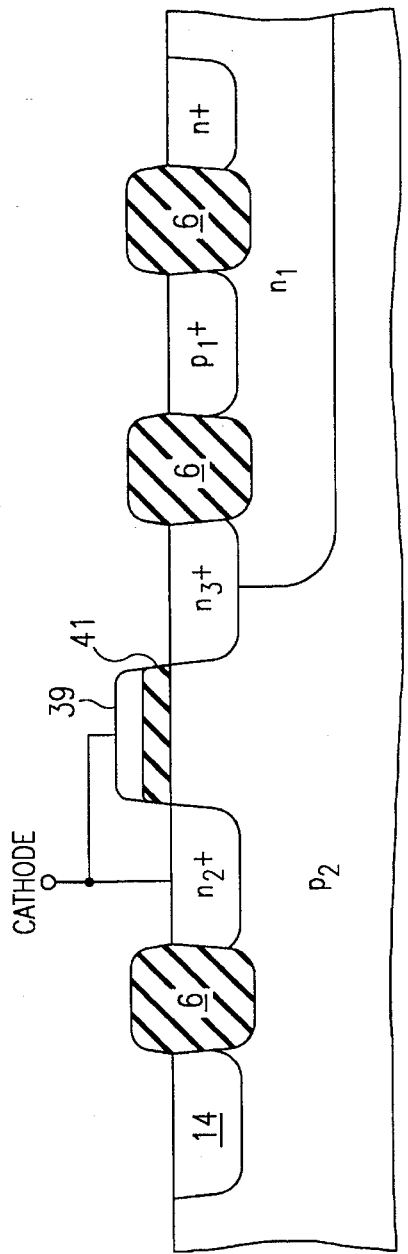
FIG. 2 illustrates a cross-sectional view/schematic drawing of a first preferred embodiment of the invention.

FIG. 2, illustrates a cross-sectional view/schematic drawing of a first preferred embodiment of the invention's SCR. This figure is similar to FIG. 1a. Note that in this drawing and in subsequent drawings that Vcc and Vss represent terminals for connection to voltages Vcc and Vss. Note that the regions between regions p1+ and n2+ have been modified as described in the following manner. Heavily doped n-type semiconductor region, n3+, has been added at the boundary of region p2 and region n1. Oxide 6 of FIG. 1a is now interposed between region n3+ and region p1+. Gate 39 and an insulator such as gate oxide 41 have also been added to FIG. 2 such that regions n2+ and n3+ are self-aligned to gate 39 thereby forming a structure substantially similar to an nMOS transistor. (Note however, that self-alignment is not required to form such an n-MOS-like structure.) Gate 39 is shown electrically connected to region n2+ so that the nMOS-like structure is normally non-conducting. The SCR is triggered (turned on) by the current generated when the nMOS-like structure described above is in avalanche breakdown. Thus the trigger voltage of the SCR is equivalent to the breakdown voltage of an nMOS transistor having the same insulator thickness and channel length as the nMOS-like device described above. This trigger voltage is significantly lower than the trigger voltage of the corresponding LSCR structure as described in FIG. 1a.

In order to adjust the trigger voltage of the SCR, oxide 41 of FIG. 2 can be made thinner to lower the voltage at which the SCR triggers. Consequently, making oxide 41 of FIG. 2 thicker raises the voltage at which the SCR triggers. Alternatively, the trigger voltage of the SCR can be made lower by reducing the gate length, which is equivalent to reducing the distance between region n2+ and region n3+. Likewise, increasing this distance raises the SCR trigger voltage. (It was assumed in foregoing statements of this paragraph that all other factors remained constant in connection with the stated operation.)

FIG. 3 illustrates a top view of the invention's SCR according to its first preferred embodiment. Elements labeled in FIG. 2 are shown in FIG. 3. Gate oxide 41 lies below the gate 39 as indicated by the hatched region. The thick oxide such as regions 6 and 16 in FIG. 2 are not marked in this figure.

FIG. 4 illustrates a cross-sectional view/schematic drawing of the preferred embodiment of an input protection scheme of the invention. As shown, the SCR illustrated in FIG. 4 now has region n3+ electrically connected to internal circuitry 36. Circuitry 36 contains the gate oxide for which ESD protection is initially sought. Although circuitry 36 is shown as an inverter including p-channel transistor 40 connected to n-channel transistor 42, other structures are possible. The structure comprising the regions n2+, n3+, 39 and 41, with electrical connections as shown in FIG. 4, is identical to a grounded-gate nMOS device which is known to provide adequate protection for gate insulators. Additionally, the invention's SCR allows the elimination of a separate large resistor, which is used in previous input protection circuits. Region n1 between region n3+ and contact n+ provides the requisite equivalent resistance. Once enough current flows to trigger the SCR, the region between p1+ and n2+ gets flooded with carriers. This effectively shorts the energy of the ESD pulse to ground. Therefore, in contrast to previous SCRs, the invention's SCR alone is effective in providing input protection.

Figure 5:
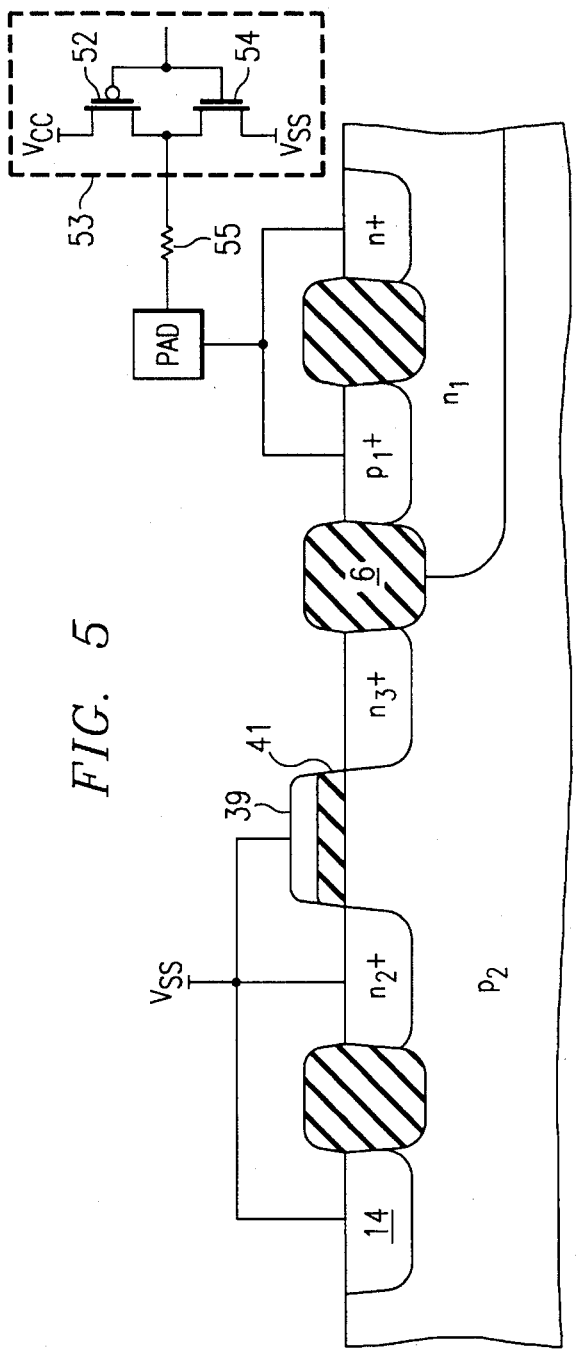
FIG. 5 illustrates a cross-sectional view/schematic drawing of a preferred embodiment of an output protection scheme of the invention.

The invention's SCR is also effective in providing protection for outputs and I/Os. FIG. 5 illustrates a schematic drawing of a preferred embodiment of an output protection scheme of the invention. As shown, pad PAD is electrically connected to the invention's SCR and to the output buffer 53. P-channel transistor 52 and n-channel transistor 54 together configured as an inverter are shown as possible elements which comprise output buffer 53. The gate length of the SCR is designed to be smaller than the gate length of the n-channel transistor 54. This difference in gate length ensures that during ESD stress the SCR triggers at a lower voltage than that at which the n-channel transistor 54 conducts. Optionally, a small resistor 55 may be placed between the pad and the drain of the output n-channel transistor 54. With this option, the gate lengths of the SCR and the n-channel transistor 54 may be the same. In FIG. 5, the gate of the invention's SCR is shown connected to the cathode. Alternatively, the gate may be connected to the gate of the output n-channel transistor.

Figure 6:
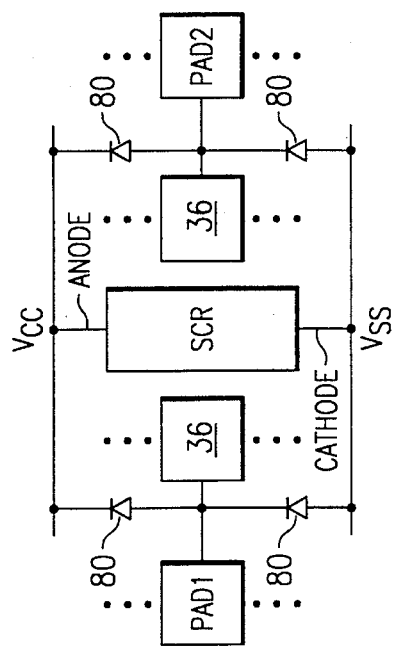
FIG. 6 is a schematic drawing of a general ESD input/output protection scheme.

FIG. 6 is a schematic drawing of a general ESD input/output protection scheme illustrating the invention's SCR connected between two power supply rail termianls such as Vcc and Vss. PAD1 and PAD2 represent a plurality of input, output or I/O pads for the protected circuitry 36. Each pad is connected to the Vcc and Vss rails by diodes 80. Thus for ESD stress between PAD1 and PAD2, a discharge path can be established through the SCR and two forward biased diodes regardless of the polarity. Since all circuitry is electrically coupled between rail terminals Vcc and Vss, and because the SCR of the invention is connected between terminals Vcc and Vss, all internal circuitry can be protected from ESD stress applied between any arbitrary pair of pads. Although FIG. 6 shows a single SCR, a multitude of these may be used at different locations on the chip. This strategy may also be extended for designs using more than 2 power buses.

Figure 7:
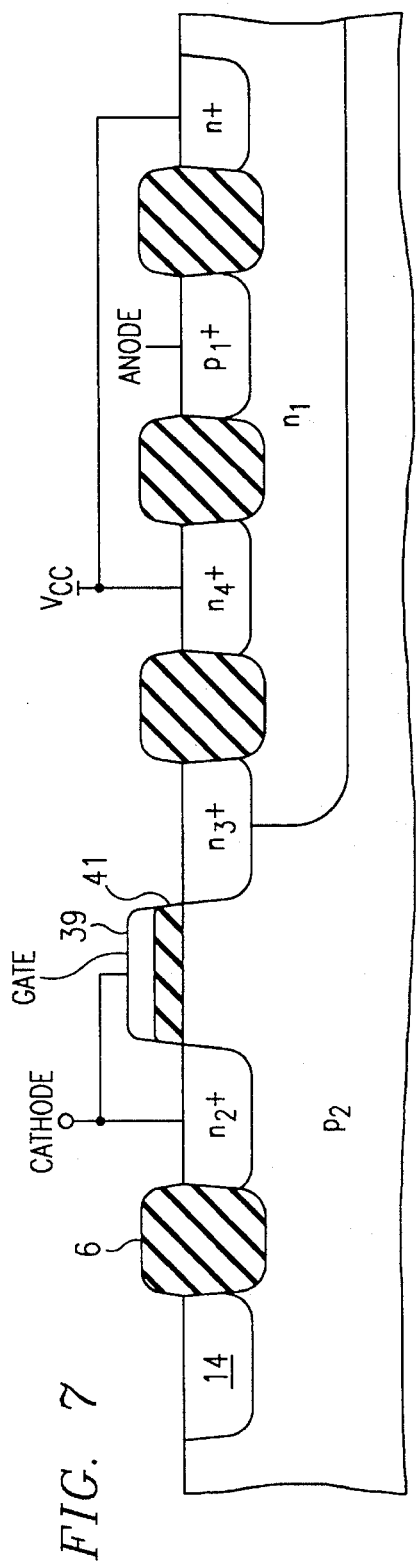
FIG. 7 illustrates cross-sectional view/schematic drawing of an embodiment of the invention which includes a guard band.

In some technologies it is possible that the invention's SCR may be triggered inadvertently under normal operating conditions (of the circuit needing ESD protection) to a latched state. The structure may be modified in order to prevent this triggering. As shown in the cross-sectional drawing of the invention's SCR in FIG. 7, a guard band comprising heavily doped n-type semiconductor material $n_4+$ is placed between regions $n_3+$ and $p_1+$. Guard band $n_4+$, region $n_3+$, and well contact n+ are electrically connected to the positive power bus. Thus band $n_4+$ is connected to to terminal Vcc, which during operation of the circuit requiring ESD protection, is connected to voltage Vcc. The presence of the guard band ensures that the latched state cannot be sustained under normal operating conditions. Note that under ESD stress conditions, this SCR will trigger at a voltage equal to or less than the trigger voltage of the SCR shown in FIG. 2.

The forgoing described invention's new SCR structure may be used to provide on-chip protection against ESD stress applied at the input, output power supply pins or between any arbitrary pair of pins of an integrated circuit. A key feature of the invention is that the structure which has the lowest breakdown voltage for a given technology is incorporated in the SCR. The current which is generated by the breakdown of the structure, which is referred to as the critical element, triggers the SCR. Usually in CMOS technologies the nMOS device with the shortest gate length is the critical element. However, in other technologies, another device may have the lowest breakdown voltage. Therefore, this device would be used as the critical element in place of the nMOS-like structure to trigger the SCR.

FIGS. 8 through 29 illustrate cross-sectional/schematic drawings of alternative embodiments of the invention. Doping types are indicated as n or p. A + sign following a doping type label indicates heavy doping and a – sign following a doping type label indicates light doping. More specifically, FIGS. 8 through 17 represent SCRs configured for output protection and FIGS. 18 through 26 represent SCR configured for input circuit protection.

Figure 8:
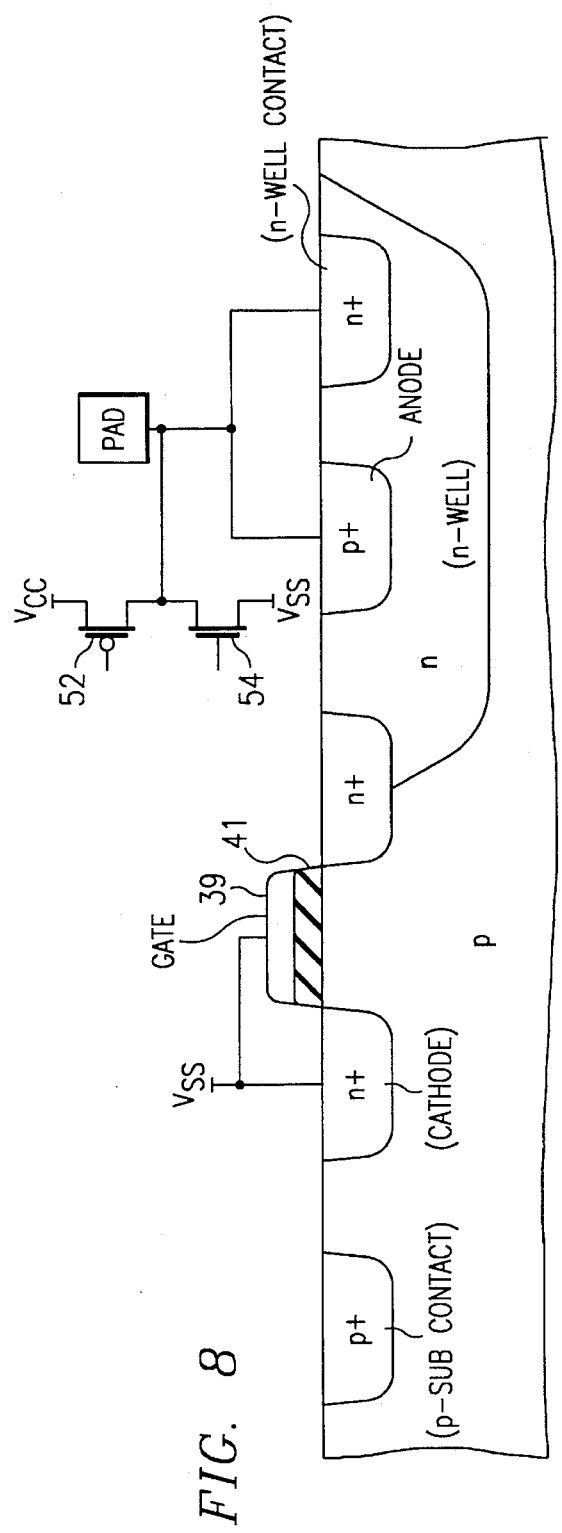

FIG. 8 illustrates an embodiment with the anode and n-well contact connected to pad PAD. Additionally, the cathode and gate 39 are connected to terminal Vss.

FIG. 9 illustrates an embodiment with the anode and n-well contact connected to pad PAD, gate 39 connected to the gate of n-type transistor 54, and the cathode connected to terminal Vss.

FIG. 10 illustrates an embodiment with the anode connected to pad PAD, the n-well connected to terminal Vcc, and the cathode and gate 39 connected to terminal Vss.

Figure 11:
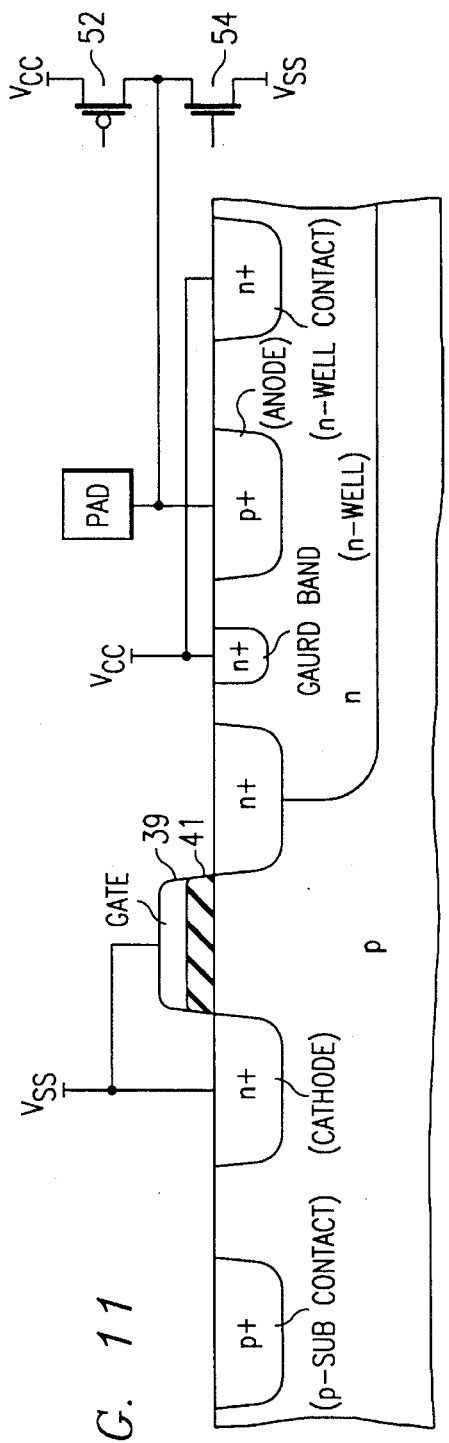

FIG. 11 illustrates an embodiment with the anode connected to pad PAD, the n-well and guard band connected to terminal Vcc and the cathode and gate 39 connected to terminal Vss.

Figure 12:
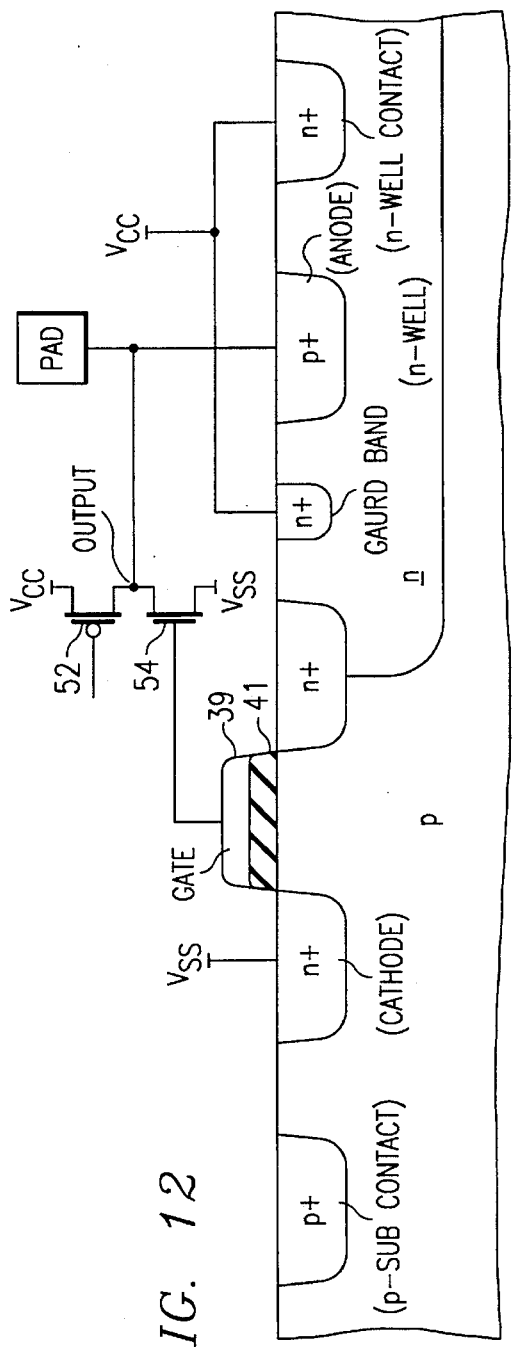

FIG. 12 illustrates an embodiment with the anode connected to pad PAD, the n-well and guard band connected to terminal Vcc, gate 39 connected to the gate of transistor 54, and the cathode connected to terminal Vss.

FIG. 13 illustrates an embodiment with the anode connected to pad PAD, the n-well connected to terminal Vcc, gate 39 connected to the gate of transistor 54, and the cathode connected to terminal Vss.

FIG. 14 illustrates an embodiment with the anode connected to pad PAD, the n substrate (n-sub) contact connected to terminal Vcc, gate 39 connected to the gate of n-type transistor 54, and the p-well contact connected to terminal Vss.

Figure 15:
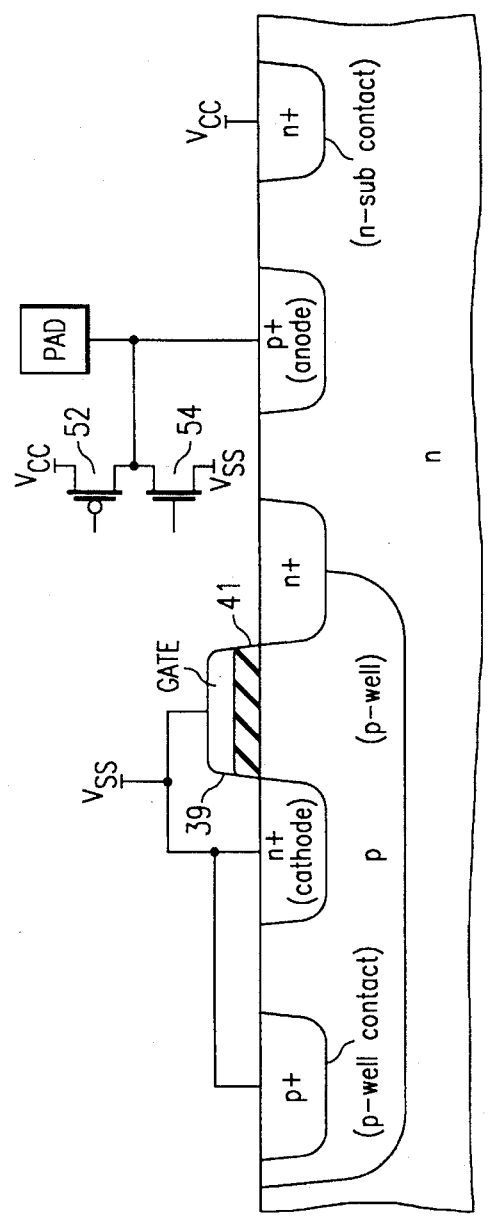

FIG. 15 illustrates an embodiment with the anode connected to pad PAD, and the n-sub contact connected to terminal Vcc. Gate 39, the cathode and the p-well contact are connected to terminal Vss.

Figure 16:
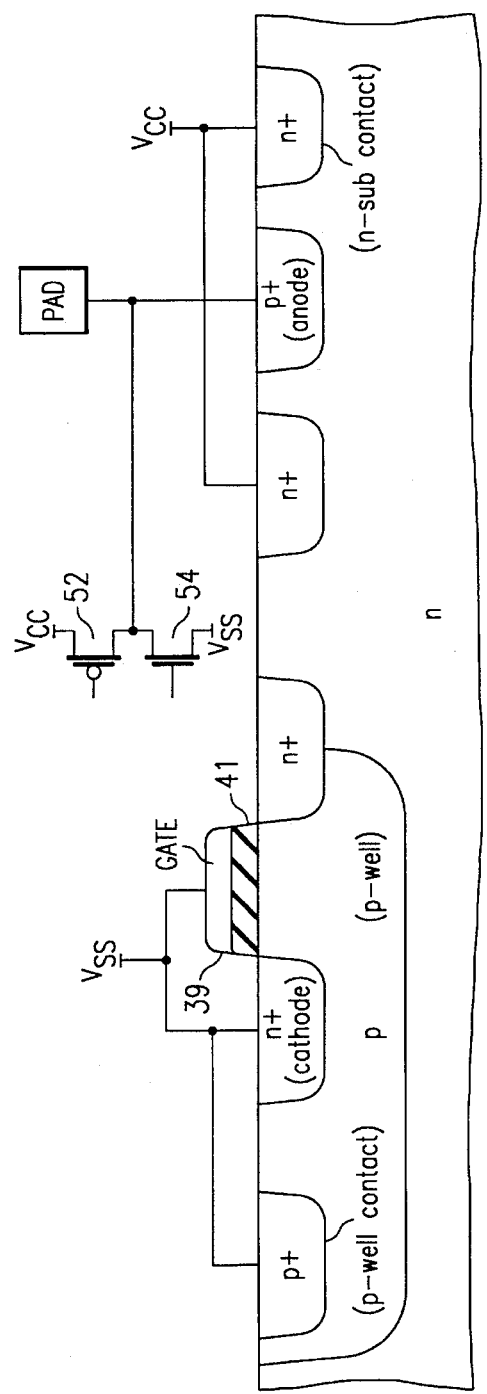

FIG. 16 illustrates an embodiment with the anode connecte to pad PAD, and n-sub and the guard band connected to terminal Vcc. Gate 39, the cathode and the p-well contact are connected to terminal Vss.

Figure 17:
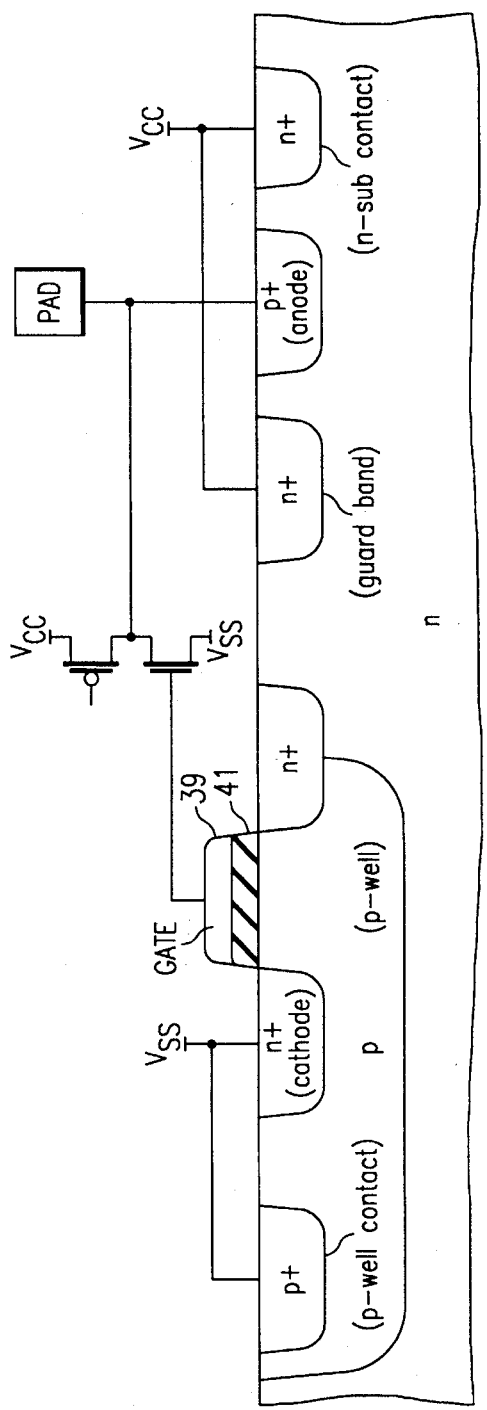

FIG. 17 illustrates an embodiment with the anode connected to pad PAD, the n-sub contact and guard band connected to terminal Vcc, gate 39 connected to the gate of transistor 54, and the cathode and p-well contact connected to terminal Vss.

Figure 18:
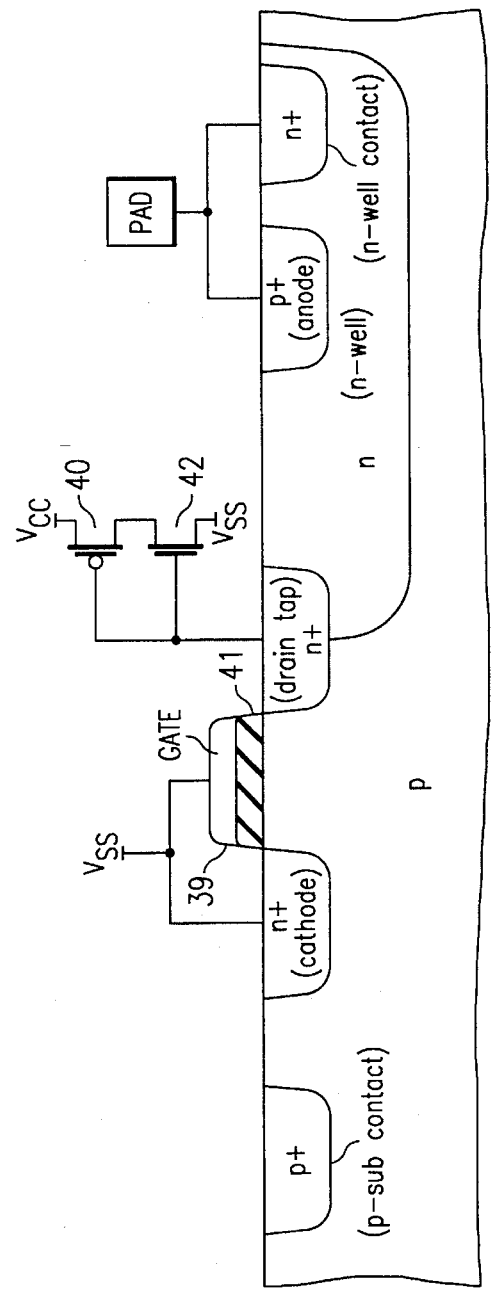

FIG. 18 illustrates an embodiment with an anode and n-well contact connected to pad PAD, the drain tap connected to the gates of transistors 40 and 42, and the cathode and gate 39 connected to the Vss terminal.

Figure 19:
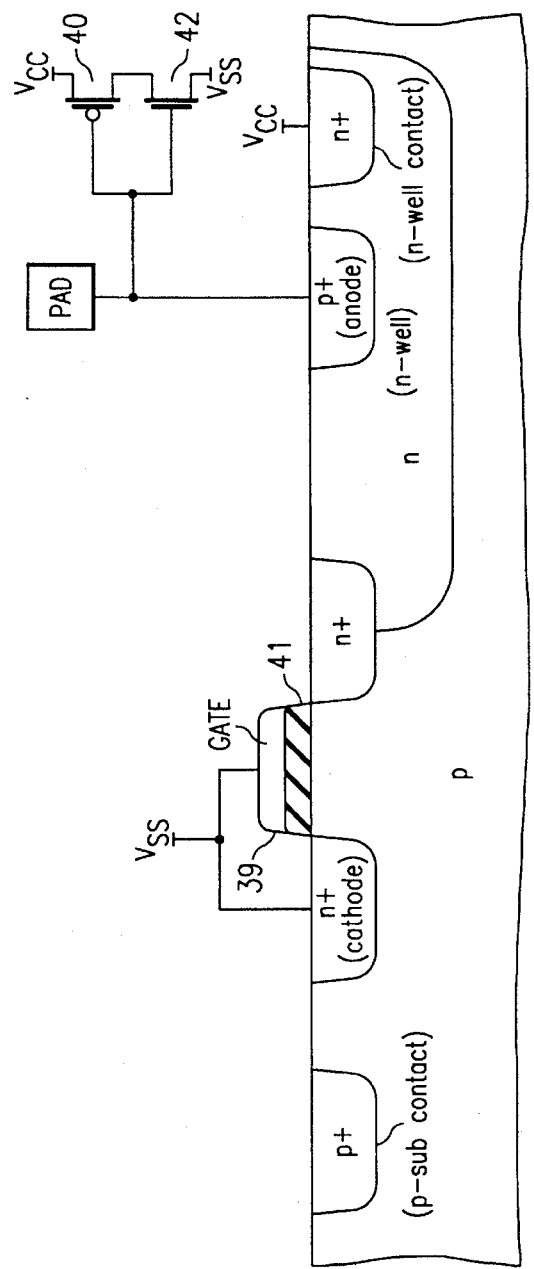

FIG. 19 illustrates an embodiment with the anode connected to pad PAD and the gates of transistors 40 and 42, the n-well contact connected to terminal Vcc, and gate 39 and the cathode connected to terminal Vss.

Figure 20:
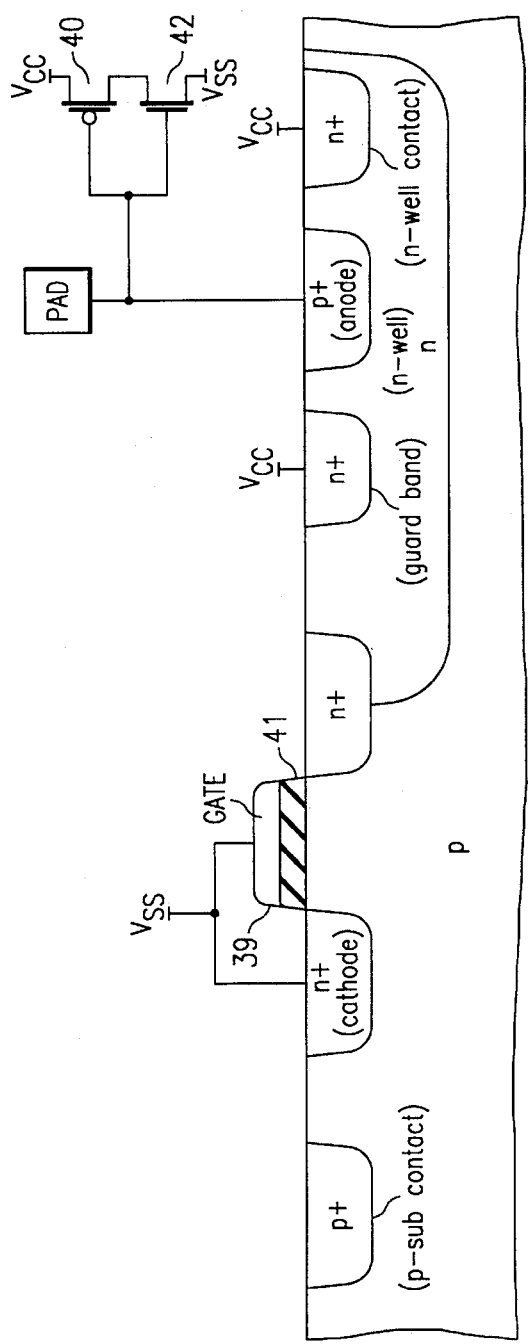

FIG. 20 illustrates an embodiment with the anode connected to pad PAD and the gates of transistors 40 and 42, the n-well contact and guard band connected to terminal Vcc, and the cathode connected to terminal Vss.

Figure 21:
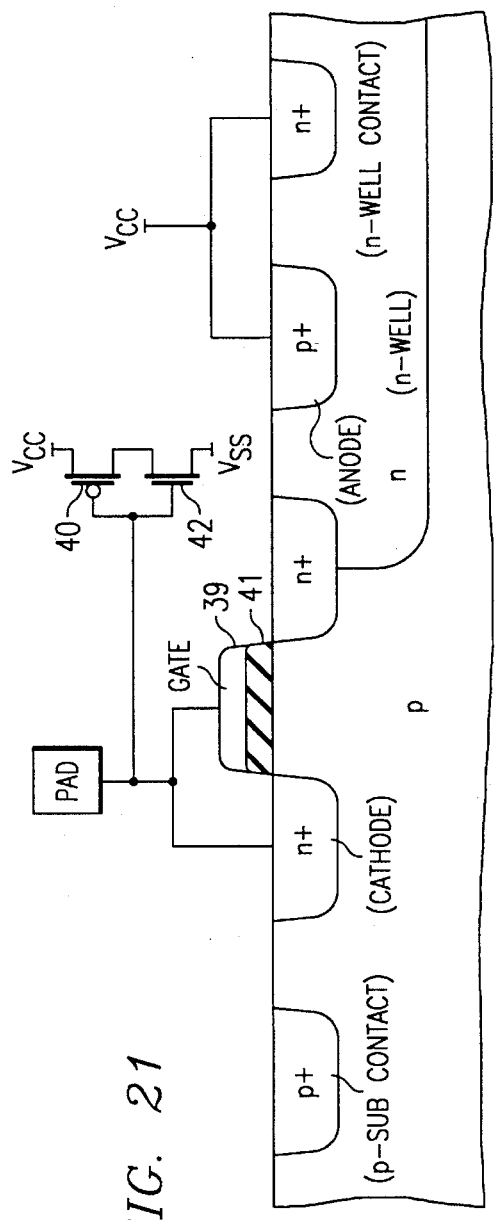

FIG. 21 illustrates an embodiment with the anode and n-well contact connected to terminal Vcc, and gate 39 and the cathode connected to pad PAD and the gates of transistors 40 and 42.

Figure 22:
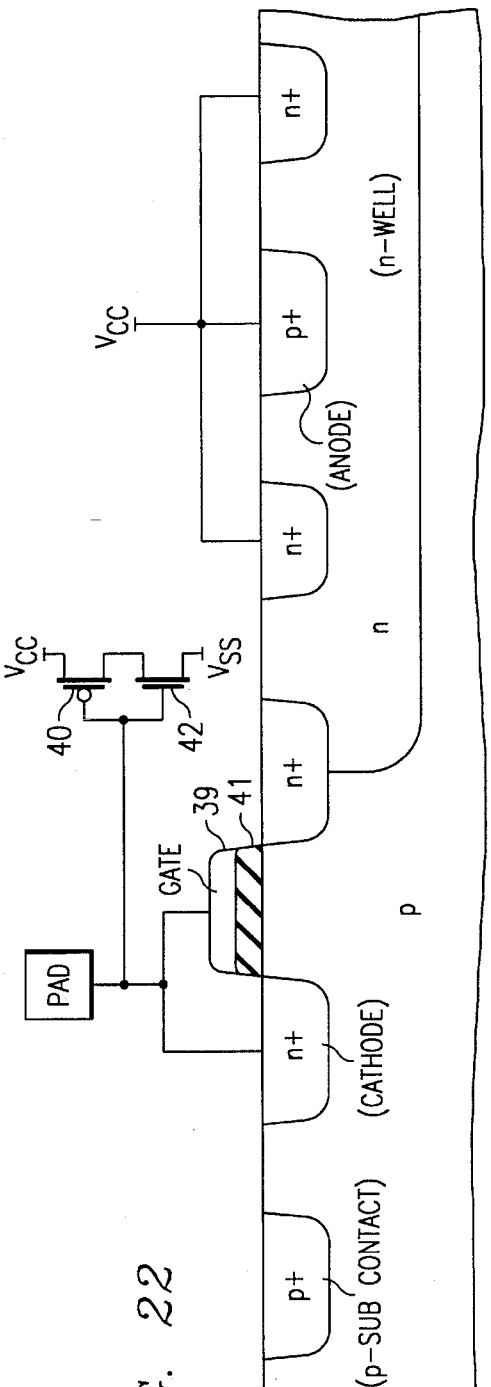

FIG. 22 illustrates an embodiment with the anode, n-well contact, and guard band connected to terminal Vcc, gate 39, and the cathode connected to pad PAD and the gates of transistors 40 and 42.

(Note: For FIGS. 23 to 26, gate 39 is part of a pMOS transistor rather than an nMOS transistor as with the preceding embodiments of the invention.)

FIG. 23 illustrates an embodiment with the anode, n-well contact and gate connected to pad PAD and the gates of transistors 40 and 42, and the cathode connected to terminal Vss.

FIG. 24 illustrates an embodiment with the anode and gate 39 connected to pad PAD and the gates of transistor 40 and 42, the n-well contact connected to terminal Vcc, and the cathode connected to terminal Vss.

Figure 25:
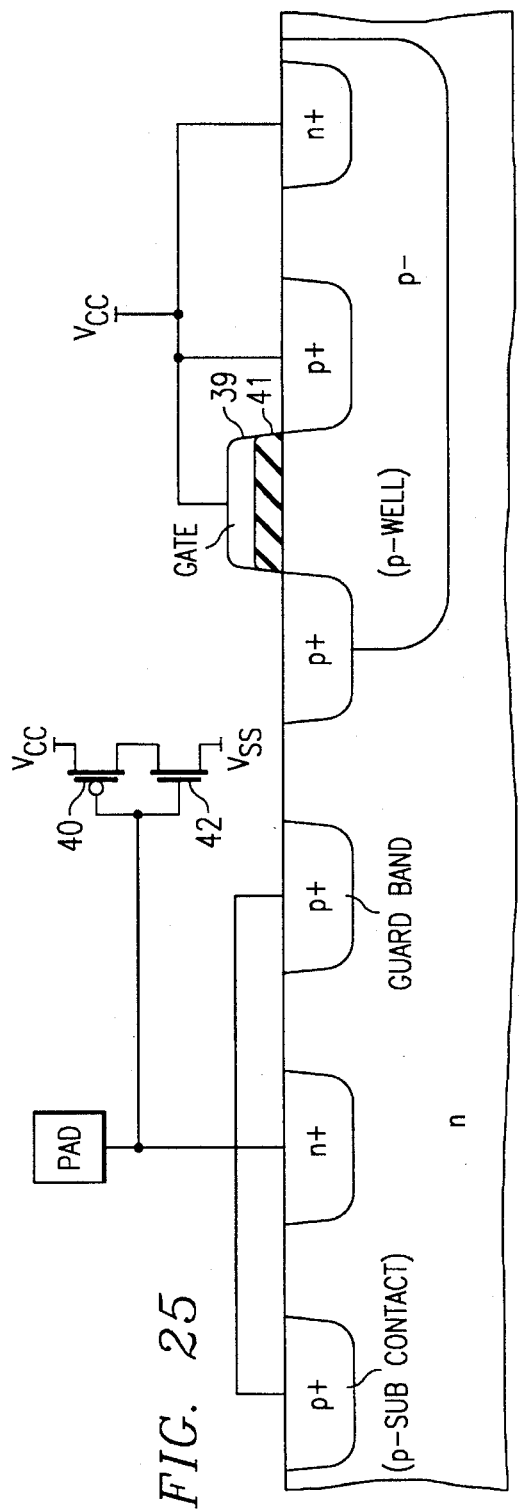

FIG. 25 illustrates an embodiment with the anode, n-well contact and gate 39 connected to terminal Vcc, the p-sub contact and guard band connected to terminal Vss, and the cathode connected to pad PAD and the gates of transistors 40 and 42.

Figure 26:
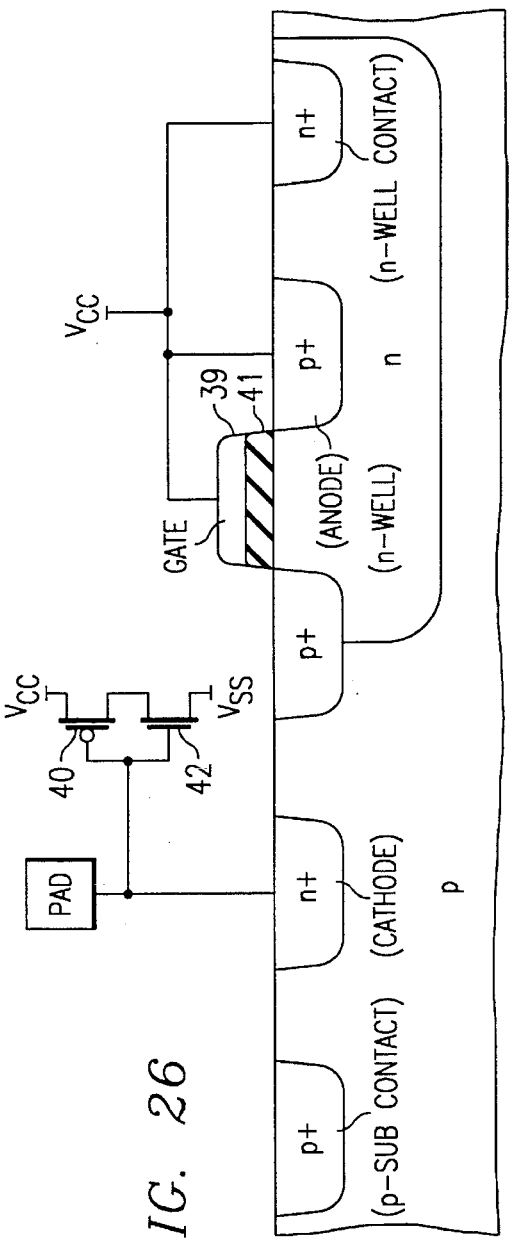

FIG. 26 illustrates an embodiment with the anode, n-well contact, and gate 39 connected to terminal Vcc and the cathode connected to pad PAD and the internal gates of transistors 40 and 42.

Figure 27:
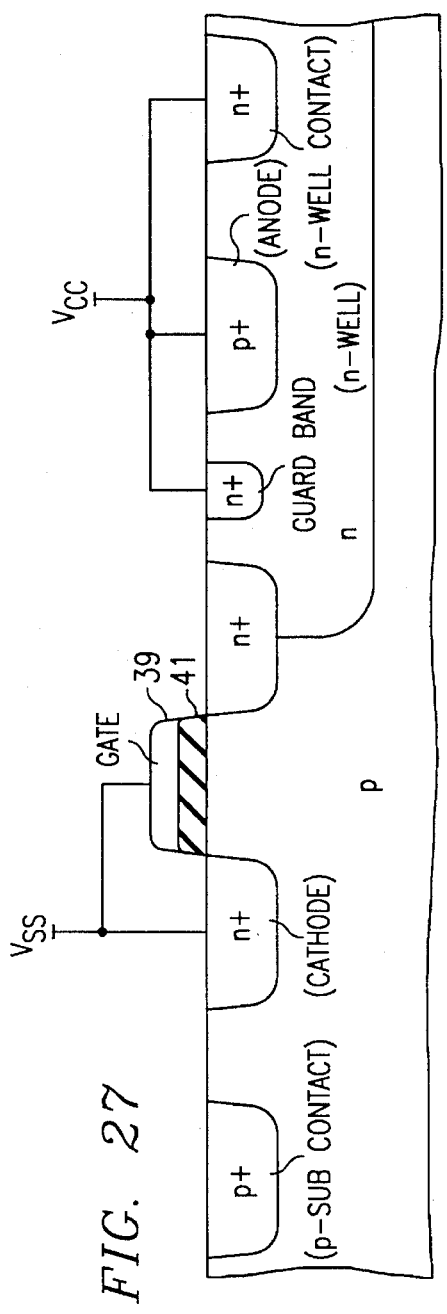

FIG. 27 illustrates an embodiment with the anode, n-well contact and the optional guard band connected to terminal Vcc. The cathode and gate 39 are connected to terminal Vss.

(Note: For FIGS. 28 and 29 gate 39 is part of a pMOS transistor)

Figure 28:
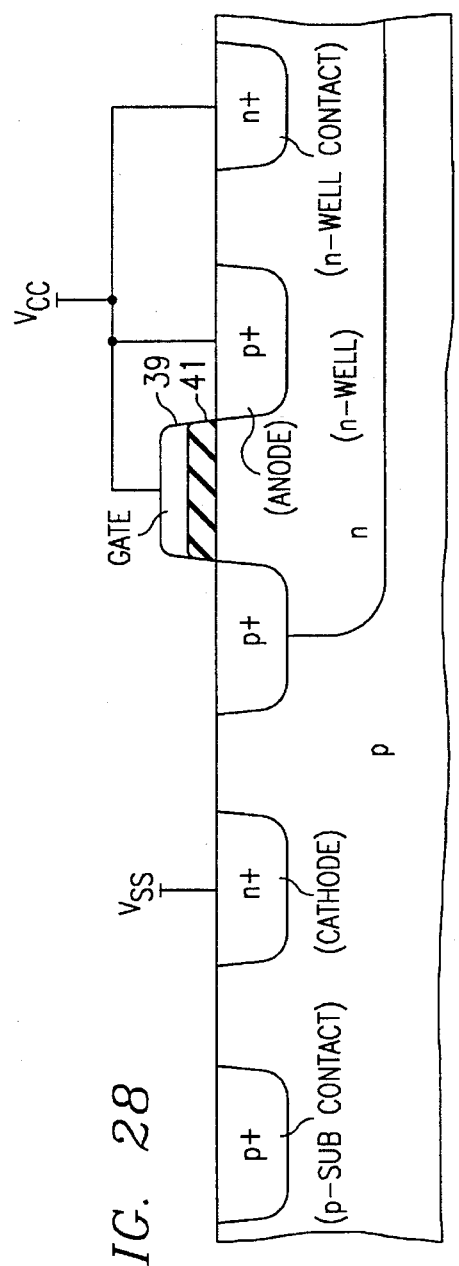

FIG. 28 illustrates an embodiment with the anode, n-well contact, and gate 39 connected to terminal Vcc. The cathode is connected to terminal Vss.

Figure 29:
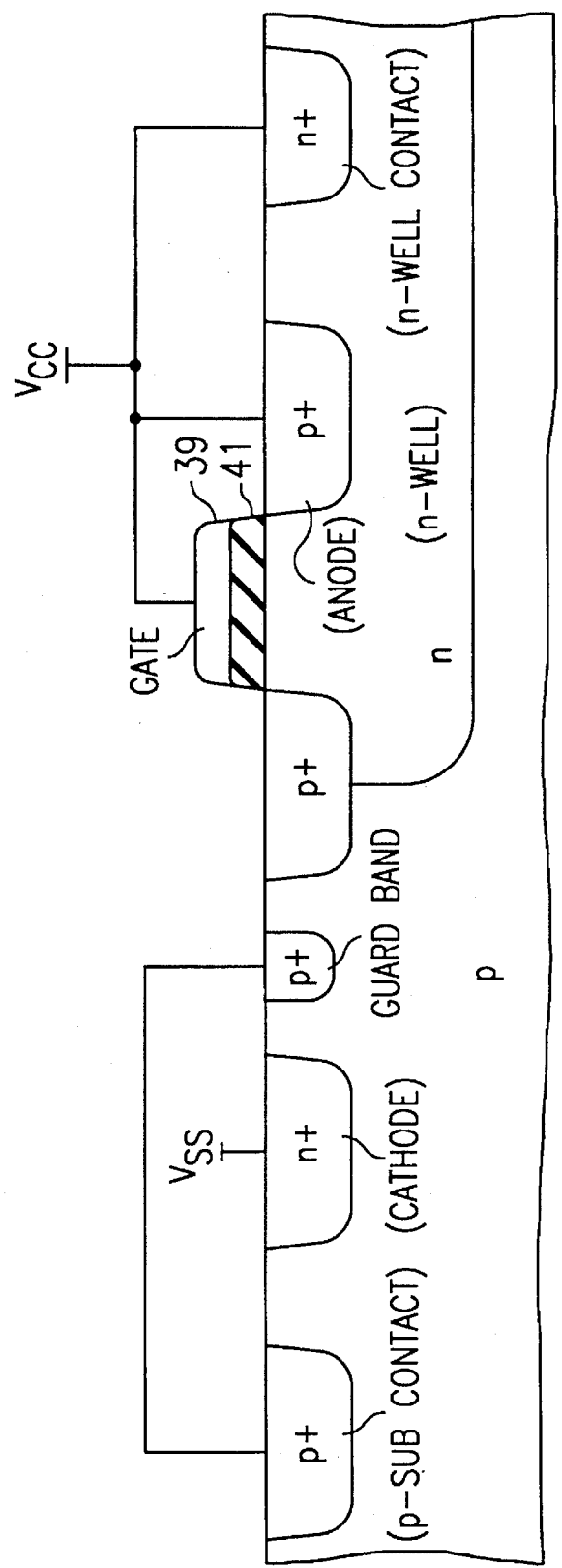

FIG. 29 illustrates an embodiment with the anode, n-well contact and gate 39 connected to terminal Vcc, and the cathode p-sub contact and guard band connected to terminal Vss.

Note that for the input and power rail protection embodiments described above, other additional embodiments are obtained by replacing all n-type regions by p-type regions and vice versa.

The foregoing invention may be used on a memory chip of the type including random access memories (dynamic or static) an EPROM (eraseable programmable read only memory) or any other semiconductor circuit requiring ESD protection.

Although the invention has been described in detail herein with reference to its preferred embodiment, and certain described alternatives, it is to be understood that this description is by way of example only, and is not to be construed in a limiting sense. It is to be further understood that numerous changes in the details of the embodiments of the invention, and additional embodiments of the invention, will be apparent to and may be made by persons of ordinary skill in the art having reference to this description. For example, although in the foregoing examples an n-channel MOS transistor or p-channel MOS transistor was identified as the critical element, an npn bipolar transistor may be the critical element. Alternatively, a pnp transistor may be the critical element. Additionally, the trigger voltage of the SCR according to the invention can be adjusted by varying design parameters of the critical element. Note that n-type semiconductor regions may be substituted consistently throughout with p-type semiconductor regions and vice versa. Additionally note that embodiments using twin wells are contemplated as within the scope of the invention. It is contemplated that all such changes and additional embodiments are within the spirit and true scope of the invention as claimed below.

We claim:

1. An integrated circuit comprising:
   a device for which ESD protection is desired, said device including at least one MOS transistor;
   a lateral semiconductor controlled rectifier coupled to said device, said semiconductor controlled rectifier including a common region;
   a MOS-like structure integral with said semiconductor controlled rectifier, said MOS-like structure also including said common region, said semiconductor controlled rectifier being operable to be triggered by a current generated when said MOS-like structure is in avalanche breakdown.

2. The integrated circuit of claim 1 wherein said MOS-like structure has a trigger voltage equivalent to the breakdown voltage of a MOS transistor having the same insulator thickness and channel length as said MOS-like structure.

3. The integrated circuit of claim 1 wherein said integrated circuit comprises a dynamic random access memory integrated circuit chip.

4. The integrated circuit of claim 1 wherein said integrated circuit comprises a read only memory integrated circuit.

5. The integrated circuit of claim 1 wherein said integrated circuit comprises static random access memory integrated circuit.

6. The integrated circuit of claim 1 wherein said semiconductor controlled rectifier is formed in a semiconductor layer of a first conductivity type and includes:
   a first region of a second conductivity type formed within said semiconductor layer;
   a well region of said second conductivity type formed within said semiconductor layer and spaced from said first region;
   a gate region overlying said semiconductor layer between said first region and said well region;
   a second region of said first conductivity type formed within said well region.

7. The integrated circuit of claim 6 wherein said semiconductor controlled rectifier further includes a third region of said second conductivity type formed within said semiconductor layer spaced from said first region and partially overlapping said well region.

8. The integrated circuit of claim 7 wherein said MOS-like structure comprises said first and third regions and said gate overlying said semiconductor layer between said first and third regions, said gate separated from said semiconductor layer by a gate insulating layer.

9. The integrated circuit of claim 1 wherein said integrated circuit is formed within a semiconductor layer of a first conductivity type wherein:
said semiconductor controlled rectifier comprises:
   a first doped region of a second conductivity type disposed in said semiconductor layer;
   a second doped region of said second conductivity type disposed in said semiconductor layer;
   a region of said semiconductor layer between said first and second doped regions; and a third doped region of said first conductivity type formed adjacent said second doped region;

and wherein said MOS-like structure comprises:

said first doped region of a second conductivity type disposed in said semiconductor layer;

said second doped region of said second conductivity type disposed in said semiconductor layer;

said region of said semiconductor layer between said first and second doped regions;

said gate dielectric of substantially said selected thickness overlying said region of said semiconductor layer between said first and second doped regions; and a conductive gate overlying said gate dielectric.

10. The integrated circuit of claim 9 wherein said second doped region comprises a well region and a heavily doped region at least partially overlapping said well region, said heavily doped region adjacent said region of said semiconductor layer between said first and second doped regions and said third doped region formed within said well region.

11. The integrated circuit of claim 10 wherein said first conductivity type comprises p-type and said second conductivity type comprises n-type.

12. A silicon controlled rectifier comprising:

a semiconductor layer, said semiconductor layer comprising silicon of a first conductivity type;

at least two semiconductor regions in spaced apart relation formed in said semiconductor layer, said at least two semiconductor regions comprising silicon of a second conductivity type, said second conductivity type different than said first conductivity type;

a gate formed over a region of said semiconductor layer between said semiconductor regions;

a gate insulator interposed between said gate and said semiconductor layer;

a well region of said second conductivity type formed in said semiconductor layer and at least partially overlapping a first of said at least two semiconductor regions; and third and fourth semiconductor regions formed in said well region, said third semiconductor region having said first conductivity type and said fourth semiconductor region having said second conductivity type.

13. The semiconductor controlled rectifier of claim 12 and further comprising a plurality of diodes connected between a first voltage and a second voltage, a semiconductor package pad connected between at least two of said diodes.

14. A silicon controlled rectifier as recited in claim 8 wherein said gate insulating region comprises an oxide.

15. A semiconductor controlled rectifier comprising:

a semiconductor layer of a first conductivity type;

a first doped region of a second conductivity type formed in said semiconductor layer, said first conductivity type different than said second conductivity type;

a second doped region of said second conductivity type formed in said semiconductor layer and spaced from said first doped region;

a gate region formed overlying said semiconductor layer between said first and second doped regions;

an insulating region formed between said gate and said semiconductor layer;

a well region of said second conductivity type formed in said semiconductor layer and partially overlapping said second doped region; and a third doped region of said first conductivity type formed in said well region.

16. The semiconductor controlled rectifier of claim 15 wherein said first and second doped regions are self-aligned with said gate.

17. The semiconductor controlled rectifier recited in claim 15 and further comprising a pad coupled to said semiconductor controlled rectifier and to circuitry requiring protection from electrostatic discharge.

18. A semiconductor controlled rectifier as recited in claim 17 which further includes a resistor connected between said pad and said circuitry requiring electrostatic discharge protection.

19. The semiconductor controlled rectifier of claim 17 wherein said semiconductor package pad comprises an output pad.

20. The semiconductor controlled rectifier recited in claim 15 and further comprising a pad coupled to said semiconductor controlled rectifier and a connection to one of said semiconductor regions for contact to circuitry requiring electrostatic discharge protection.

21. The semiconductor controlled rectifier of claim 15 wherein said first doped region is electrically coupled to said gate region.

22. The semiconductor controlled rectifier of claim 15 and further comprising a contact region of said first conductivity type formed in said semiconductor layer, said contact region having a higher doping concentration than said semiconductor layer.

23. The semiconductor controlled rectifier of claim 15 and further comprising a fourth doped region of said second conductivity type formed in said well region.

24. The semiconductor controlled rectifier of claim 15 wherein said semiconductor layer of a first conductivity type comprises a p-doped silicon layer.

25. The semiconductor controlled rectifier of claim 15 and further comprising fourth and fifth doped regions of said second conductivity type formed within said well region, wherein said third doped region is disposed between said fourth and fifth doped regions.

26. The semiconductor controlled rectifier of claim 15 wherein said insulating region comprises an oxide.

27. The semiconductor controlled rectifier of claim 15 wherein said doped region and well region are electrically coupled to a contact pad.

28. The semiconductor controlled rectifier of claim 27 wherein said second doped region is coupled to a circuit to be protected from ESD.

29. The semiconductor controlled rectifier of claim 28 wherein said contact pad comprises an input pad.

30. The semiconductor controlled rectifier of claim 28 wherein said gate is electrically coupled to said first doped region and to said semiconductor layer.

31. The semiconductor controlled rectifier of claim 27 wherein said third region and said well region are also electrically coupled to a circuit to be protected from ESD.

32. The semiconductor controlled rectifier of claim 31 wherein said contact pad comprises an output pad.

33. The semiconductor controlled rectifier of claim 27 wherein said gate is coupled to a CMOS inverter.

34. A silicon controlled rectifier comprising:

a first n-type silicon region;

a first p-type silicon region adjacent said first n-type region;

an insulating layer formed over said first p-type region;

a gate formed over said insulating layer;

a second n-type silicon region adjacent said first p-type region such that said first n-type region is spaced from said second n-type region by said first p-type region, said second n-type region comprising an n-doped region and an n-well region, said n-doped overlapping said n-well region; and a second p-type silicon region adjacent said second n-type region such that said first p-type region is spaced from said second p-type region by said second n-type region, said second p-type region formed within said n-well region.

35. A silicon controlled rectifier as recited in claim 13 wherein said first conductivity type comprises p-type and said second conductivity type comprises n-type.

36. The integrated circuit of claim 1 wherein said device for which ESD protection is desired includes at least one CMOS device.

37. The integrated circuit of claim 36 wherein said device for which ESD protection is desired includes an inverter.

* * * * *